(12) United States Patent
Al Omari et al.

(10) Patent No.: US 10,043,732 B1
(45) Date of Patent: Aug. 7, 2018

(54) HEAT SINK

(71) Applicant: UNITED ARAB EMIRATES UNIVERSITY, Al-Ain (AE)

(72) Inventors: Salah Addin Burhan Al Omari, Al Ain (AE); Abdallah Ghazal, Al Ain (AE)

(73) Assignee: UNITED ARAB EMIRATES UNIVERSITY, Al-Ain (AE)

( * ) Notice: Subject to any disclaimer, the term of this patent is extended or adjusted under 35 U.S.C. 154(b) by 0 days.

(21) Appl. No.: 15/614,524

(22) Filed: Jun. 5, 2017

(51) Int. Cl.
| | |
|---|---|
| *H01L 23/42* | (2006.01) |
| *H01L 23/427* | (2006.01) |
| *H01L 23/373* | (2006.01) |
| *H01L 29/06* | (2006.01) |
| *H01L 23/40* | (2006.01) |

(52) U.S. Cl.
CPC ...... *H01L 23/4275* (2013.01); *H01L 23/3735* (2013.01); *H01L 29/0657* (2013.01); *H01L 23/40* (2013.01); *H01L 2224/16* (2013.01); *H01L 2924/01031* (2013.01)

(58) Field of Classification Search
CPC ..... H01L 23/3738; H01L 23/34; H01L 23/36; H01L 23/373; H01L 23/367
See application file for complete search history.

(56) References Cited

U.S. PATENT DOCUMENTS

| | | | | |
|---|---|---|---|---|
| 5,170,930 A | * | 12/1992 | Dolbear | H01B 1/02 228/123.1 |
| 5,272,491 A | * | 12/1993 | Asakawa | B41J 2/1408 165/104.33 |
| 9,000,473 B2 | | 4/2015 | Lee et al. | |

(Continued)

FOREIGN PATENT DOCUMENTS

CN 101775270 A 7/2010

OTHER PUBLICATIONS

Song, Sihong, et al. "Experimental study on laminar convective heat transfer of microencapsulated phase change material slurry using liquid metal with low melting point as carrying fluid." International Journal of Heat and Mass Transfer 73 (2014) : 21-28.

(Continued)

*Primary Examiner* — Caridad Everhart
*Assistant Examiner* — Ankush K Singal
(74) *Attorney, Agent, or Firm* — Richard C. Litman

(57) ABSTRACT

The heat sink is a body or block of solid-phase gallium having a plurality of sealed cavities defined therein containing an unencapsulated phase change material (other than gallium). The solid-phase gallium may be disposed in a container having at least one open face (contact face) adapted for direct contact with the heat source requiring cooling so that the interface between the heat source and the heat sink includes a region of melted gallium for improved heat transfer. Heat from the heat source is rapidly conducted through the region of melted gallium, then through solid-phase gallium, and is absorbed by the phase change material in the cavities without significant change in temperature, maintaining viability of the heat sink. The heat sink may include inclined tubes through the solid-phase body of gallium, the tubes being open at opposite ends for passage of a cooling medium, such as air or cold water.

20 Claims, 4 Drawing Sheets

(56) References Cited

U.S. PATENT DOCUMENTS

| | | | |
|---|---|---|---|
| 2002/0108847 A1* | 8/2002 | Cuomo | C23C 14/0063 204/192.12 |
| 2005/0061474 A1* | 3/2005 | Gelorme | H01L 23/433 165/80.2 |
| 2005/0077615 A1* | 4/2005 | Yu | H01L 23/367 257/706 |
| 2005/0228097 A1 | 10/2005 | Zhong | |
| 2006/0238984 A1* | 10/2006 | Belady | H01L 23/367 361/704 |
| 2008/0101073 A1* | 5/2008 | Hayman | A61C 19/004 362/373 |
| 2009/0312976 A1* | 12/2009 | Bingham | G01J 5/522 702/99 |
| 2010/0246133 A1* | 9/2010 | Schmidt | H01L 23/367 361/705 |
| 2011/0125444 A1* | 5/2011 | Topham | G01J 5/522 702/99 |
| 2011/0182309 A1* | 7/2011 | Deri | H01S 5/02469 372/36 |
| 2015/0204612 A1* | 7/2015 | Sun | F28D 1/0233 165/104.14 |
| 2016/0169591 A1* | 6/2016 | Thiagarajan | F28D 15/02 165/104.21 |
| 2016/0212878 A1* | 7/2016 | Quinn | H05K 7/2039 |
| 2017/0352778 A1* | 12/2017 | Chien | H01L 33/0079 |

OTHER PUBLICATIONS

Haoshan Ge et al., "Keeping Smartphones Cool With Gallium Phase Change Material", J. Heat Transfer 135 (5), 054503 (Apr. 2013) Abstract only.

\* cited by examiner

HEAT SINK

BACKGROUND OF THE INVENTION

1. Field of the Invention

The present invention relates to heat sinks, and particularly to a heat sink made by disposing a phase change material in sealed cavities defined in a body or block of gallium in the solid phase. The heat sink may be used to cool a hot fluid, such as hot water, to dissipate heat generated by an electronic component, such as an integrated circuit, in an electronic circuit, or to cool other materials.

2. Description of the Related Art

A heat sink allows heat to be transferred from a heat source (e.g., a hot fluid or a hot solid) to the sink, thus sparing the consequences of excessive heat in the source, such as a transistor or other power electronics. Although various materials have been used in heat sinks, there is still a need for improvement in the rapid removal of excess heat from a heat source in particular applications, particularly to take full advantage of the high thermal conductivity of liquid metals, especially gallium. While gallium has high thermal conductivity, its utility as a heat sink is limited by its low specific heat capacity. As a result of its low specific heat capacity, a given quantity of gallium quickly absorbs enough heat that it no longer serves as a sink to draw heat from the material to be cooled.

Thus, a heat sink solving the aforementioned problems is desired.

SUMMARY OF THE INVENTION

The heat sink is a body or block of solid-phase gallium having a plurality of sealed cavities defined therein containing an unencapsulated phase change material (other than gallium). The solid-phase gallium may be disposed in a container having at least one open face (contact face) adapted for direct contact with the heat source requiring cooling so that the interface between the heat source and the heat sink includes a region of melted gallium for improved heat transfer. Heat from the heat source is rapidly conducted through the region of melted gallium, then through solid-phase gallium, and is absorbed by the phase change material in the cavities without significant change in temperature, maintaining viability of the heat sink. The heat sink may include inclined tubes through the solid-phase body of gallium, the tubes being open at opposite ends for passage of a cooling medium, such as air or cold water. The heat sink may be used to cool a hot fluid, such as hot water, to dissipate heat generated by an electronic component, such as an integrated circuit, in an electronic circuit, or to cool other materials.

These and other features of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

The heat sink is a body or block of solid-phase gallium having a plurality of sealed cavities defined therein containing an unencapsulated phase change material (other than gallium). The solid-phase gallium may be disposed in a container having at least one open face (contact face) adapted for direct contact with the heat source requiring cooling so that the interface between the heat source and the heat sink includes a region of melted gallium for improved heat transfer. Heat from the heat source is rapidly conducted through the region of melted gallium, then through solid-phase gallium, and is absorbed by the phase change material in the cavities without significant change in temperature, maintaining viability of the heat sink. The heat sink may include inclined tubes (i.e., tubes extending at an oblique angle through the housing and the body of solid-phase gallium) extending through the solid-phase body of gallium, the tubes being open at opposite ends for passage of a cooling medium, such as air or cold water. The heat sink may be used to cool a hot fluid, such as hot water, to dissipate heat generated by an electronic component, such as an integrated circuit, in an electronic circuit, or to cool other materials.

Figure 5:
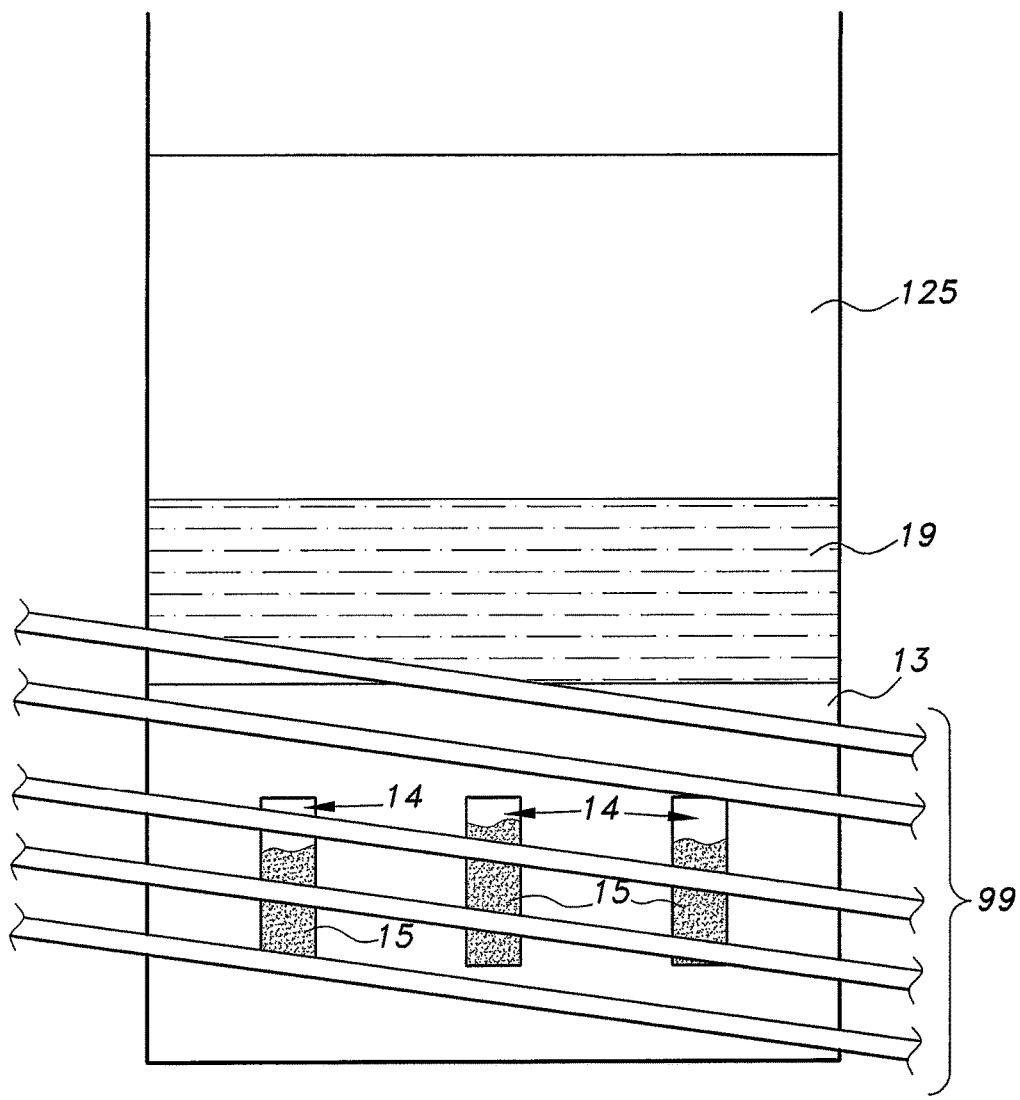
FIG. 5 is a diagrammatic front view of an embodiment of a heat sink according to the present invention having inclined cooling tubes extending through the body of solid-phase gallium.

As shown in FIG. 5, the heat sink may be disposed in an open-top container or housing, and the heat source may be placed directly on top of the heat sink in direct contact with the body or block of solid-phase gallium. The bottom of the housing may be a thermally conductive material, such as brass, and may be placed in contact with ice or other cooling medium to help maintain the integrity of the cavities 14 in the solid-phase gallium 13. The solid-phase gallium 13 is preferably pure or elemental gallium. Due to its low melting point (about 29° C., which is only a few degrees above room temperature, which is about 25° C.), a portion of the solid-phase gallium in contact with the heat source 125 melts, assuming a liquid or semi-solid phase 19. When properly selected, the solid-phase gallium 13 has sufficient thickness that the integrity of the cavities housing the phase change material 15 is not affected by melting of the region of gallium in direct contact with the heat source 125.

The heat source 125 may be a fluid, such as hot water. Since water and liquid-phase gallium are immiscible, and since liquid-phase gallium is denser than water, the water and the melted or liquid-phase gallium maintain phase separation, with the water 125 remaining above the melted or liquid-phase gallium 19. The present inventors have found that thermal conduction between hot water and liquid gallium is greater when the hot water is in direct contact with the liquid gallium than when the hot water is disposed in a pipe or other heat exchange container or conduit, since heat does not have to be transferred through an intermediate wall to the heat sink. The liquid gallium or melted gallium interface 19 between the heat source 125 and the solid-phase gallium 13 appears to enhance thermal conductivity and heat transfer rates.

Alternatively, the heat source 125 may be heat generated by electronic components operating in an electronic circuit. Since it is necessary to protect the circuit from shorting the electrical contacts, the circuit should be mounted on a circuit board that is capable of maintaining electrical isolation between the heat-generating components and the heat sink, but which has good thermal conductivity. Such circuit boards, e.g., ceramic circuit boards, are well known in the art. However, care should be taken that the ceramic material is inert when placed in contact with solid-phase gallium. Therefore, aluminum-based ceramics should not be used. However, a suitable circuit board with the components mounted on the top of the board may be placed on the heat sink with the thermally conductive bottom face of the board in direct contact with the gallium of the heat sink.

Figure 1:
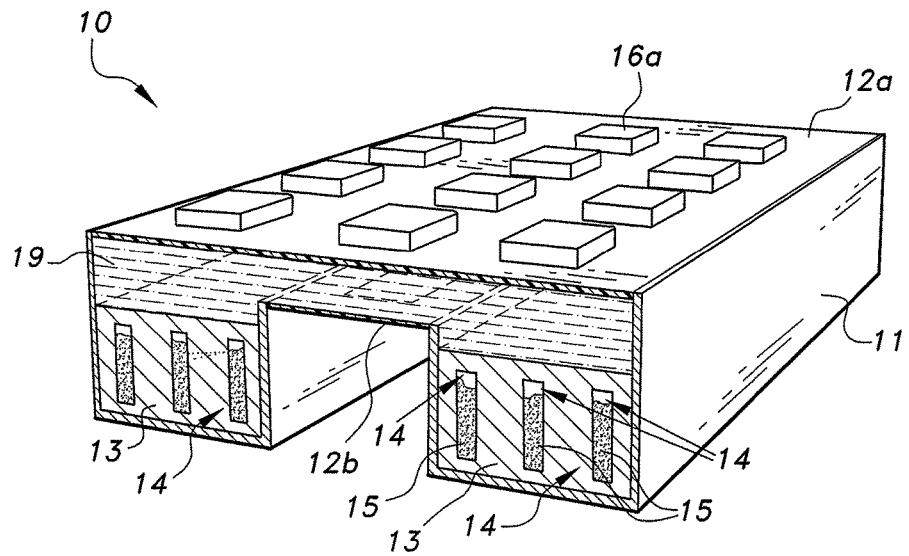
FIG. 1 is a perspective view in section of one embodiment of a heat sink according to the present invention as seen from above.
Figure 2:
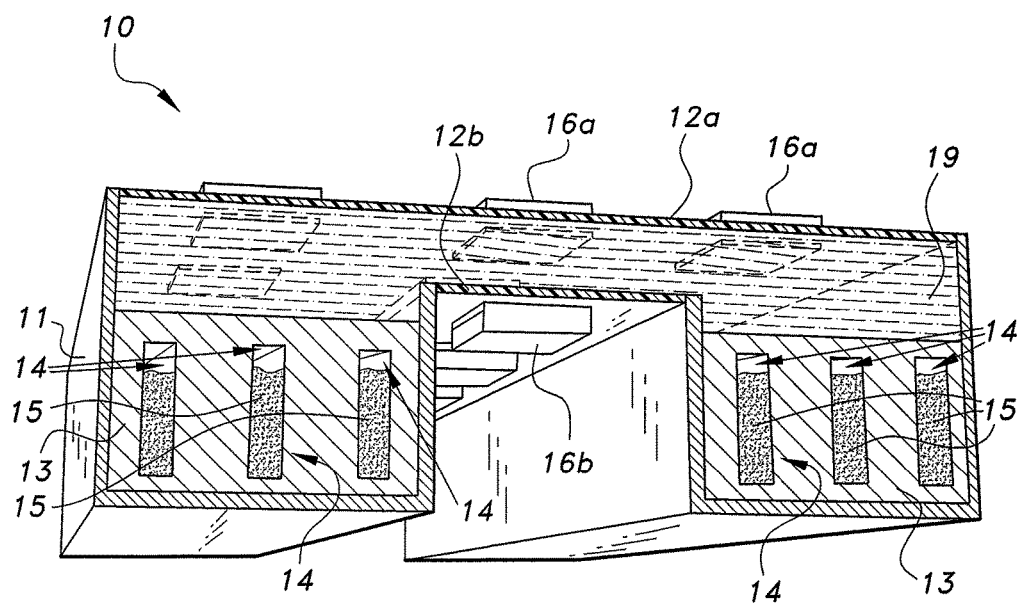
FIG. 2 is a perspective view in section of the heat sink embodiment of FIG. 1 as seen from below.

FIGS. 1 and 2 show alternative configurations for mounting an electronic circuit on the heat sink for dissipation of heat. The circuit may be mounted to the heat sink housing from the top or from the bottom. The heat sink 10 shown in FIGS. 1 and 2 has a body or block 13 of solid-phase gallium having cavities 14 containing a phase change material (PCM) 15 having a specific heat capacity greater than gallium. A variety of PCMs can be used, for example, paraffin of different kinds, and fatty acids and other organic and inorganic materials. For example, n-hexadecane or n-heptadecane can be used, both of which have melting temperatures in a range that could be suitable for use in electronics cooling applications, especially with a heat sink such as the present heat sink 10, namely, from roughly 18° C. to 23° C. The phase change material 15 may be installed by drilling the cavities 14 in solid-phase gallium 13, placing the phase change material 15 in the cavities 14, and sealing the cavities 14 with additional solid-phase gallium. The phase change material 15 is unencapsulated so that heat is transferred directly from the solid-phase gallium 13 to the phase change material 15 through the walls of the cavities 14, leading to faster heat transfer to the phase change material 15, further avoiding temperature rise of the gallium. The phase change material 15 may be a flowable material, such as a powder or beads, or in chunks, but in any event, is in direct contact with the solid-phase gallium 13 at the walls of the cavity 14. The relatively low melting temperature of gallium (about 29° C.) makes it very attractive as sink material to cool down heat sources typically found in electronics industries. Although the main focus is to apply the present heat sink to electronics cooling industries, the present heat sink can be applied to a wide range of industries where effective removal of heat from a heat source (whether hot solid or fluid) is sought.

As shown in FIGS. 1 and 2, this embodiment of the heat sink 10 has a housing 11 that includes an open-top box-shaped structure having a central elongated recess in the bottom wall defining parallel elongate channels having outer walls that are taller than the corresponding inner walls. It should be understood that the overall contouring and relative dimensions of the heat sink 10 and its housing 11 are shown for exemplary purposes only. An upper circuit board 12*a* having heat-generating electronic components 16*a* mounted on its top surface extends across the open top of the housing 11 between the opposing outer walls and from front to back of the housing 11. A lower circuit board 12*b* extends between the inner walls and may have heat-generating electronic components 16*b* mounted on its bottom-facing surface. Thus, the housing 11 defines two deep wells joined by a shallow central region that can be filled with solid-phase gallium. The cavities 14 containing the phase change material 15 may be located in the deep wells. When the electronic circuits are operating, heat generated by the components 16*a* mounted above the heat sink is transferred through the upper circuit board 12*a* to the gallium, and heat generated by the components 16*b* is transferred to the gallium through the lower circuit board 12*b*, causing solid-phase gallium between the upper circuit board 12*a* and the lower circuit board 12*b* to melt and assume the liquid phase 19. Heat is transferred from the liquid phase 19 to solid-phase gallium 13, and is further absorbed by the phase change material 15 up to the heat capacity of the phase change material without temperature change of the solid-phase gallium 13.

The basic concept is placing the heat generating component on top of a circuit board, which is, in turn, attached to a substrate such that it directly touches the sink material with no gaps between them. Having no gaps between the melted sink liquid and the bottom side of the circuit board decreases the thermal barrier for heat transfer from the hot components to the heat sink. The circuit board may even be partially dipped into the sink material to increase heat transfer rate to the sink, by pressing it downward to some degree but still in a way that does not harm electrical isolation from the electronics. This will make perfect contact with the sink material and the bottom side of the board and will not allow for gaps that can cause reduction in heat transfer rates. It should be noted that there is no need for thermal filler materials between the heat sink material and the circuit board, similar to those needed in case of solid-to-solid contact. Here, the fact that there is melted high thermal conductivity liquid directly contacting the bottom side of the circuit board, with no fillers or gaps in between, and at the same time is not susceptible to contact and adhesion problems and issues typical for traditional circuit boards attached to heat sinks, ensures a high heat transfer rate from the heat-generating component. The initial pressing of the printed circuit board into the sink material is needed especially in case the system was shut down and the sink material was totally frozen (i.e., completely in the solid phase) at the beginning. Then, this deep penetration of the board into the solid sink material will assure later on (after partial melting of the sink material upon receiving some heat from the heat source) complete and intimate contact with no gaps of any kind between the heat sink and the circuit board, and hence high heat transfer rates.

The circuit board may be made of materials, such as ceramics, that are known to have high thermal conductivity, while at the same time having the needed electrical isolation features. For example, some ceramics have thermal conductivity levels comparable to metals, such as aluminum. The ceramics should be compatible with the sink material. For example, aluminum is not compatible with gallium, so the composition of these ceramics, especially if they are Al-based, needs to be checked against compatibility with the sink material used.

To further enhance heat transfer from the heat-generating component(s) mounted on the printed circuit board, the side of the board that is in contact with the sink material can (for example) be corrugated, or can be made such that it has intruding elements, making them act like fins.

There are different concepts for the orientation to placing the heat-generating components relative to the heat sink. In FIG. 5, for example, the heat source is mounted on top of the heat sink. In another orientation possibility, the heat sink can be disposed on top and the heat-generating component can be attached to it from below, e.g., as the liquid-phase gallium 19 is disposed above the circuit board 12b in FIGS. 1 and 2. In such a case, the path of heat transfer will be in the upward direction from the heat source to the heat sink via a circuit board. This arrangement may have its own favorable heat transfer features, as compared with the arrangement of circuit board 12a and components 16a depicted in FIGS. 1 and 2.

The outer physical housing 11 of the heat sink 10 may be manufactured in such a way that the housing 11 includes fins to enhance heat transfer to the cooler outer surroundings. This will work best in the case where the whole assembly is located in an air-conditioned space. In addition, if not otherwise possible, the outer surface of the housing 11 might be covered with a high thermal conductivity blanket that is porous and that is allowed to soak water in such a way that will cause drop of the temperature of the outer surface of the sink 10, which will, in turn, help pass the heat out of the heat sink 10 to the outer surroundings more effectively. In this case, however, humidity levels need to be considered, particularly when the sink 10 is integrated in an overall system that requires care and certain precautions related to humidity. An external fan may be added to blow surrounding cool air around the outer casing or housing 11 of the heat sink 10, which will help keep low temperatures, especially if the outer walls are porous and soaking in cool water (due to evaporative cooling of the water).

Figure 3A:
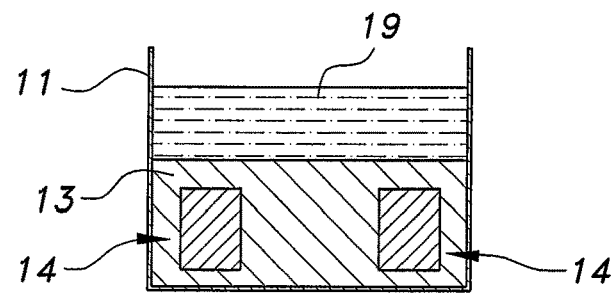
FIG. 3A is a schematic diagram of an embodiment of a heat sink according to the present invention having structured cavities regularly distributed in the solid-phase gallium body.
Figure 3B:
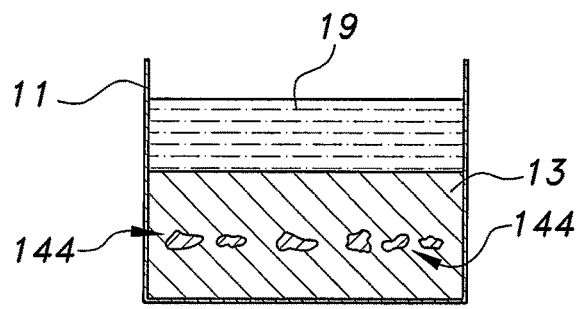
FIG. 3B is a schematic diagram of an embodiment of a heat sink according to the present invention having irregularly shaped cavities randomly distributed at substantially uniform depth within the solid-phase gallium body.
Figure 3C:
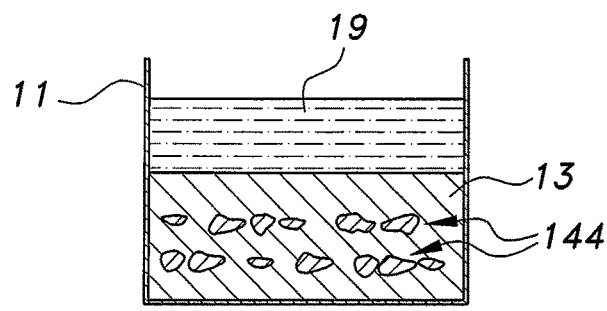
FIG. 3C is a schematic diagram of an embodiment of a heat sink according to the present invention having irregularly shaped cavities randomly distributed at two different levels within the solid-phase gallium body.

Different arrangements of the PCM-filled cavities may be considered. The cavities may be well-defined repeatable structures, or may also be dispersed in the solid sink material body at random. To accommodate as large an amount as possible of the PCM material (while at the same time keeping the interconnectivity with the solid-phase gallium to ensure smooth and effective heat transfer passages within the solid sink), the PCM cavities may be layered in more than one layer on top of each other. For example, as shown in FIG. 3A, the PCM filled cavities 14 may be engineered, and regularly shaped, e.g., cylindrical or rectangular cavities. Alternatively, as shown in FIG. 3B, the heat sink may include irregularly shaped PCM filled cavities 144 disposed in a single layer in the solid gallium portion 13. In yet another embodiment, shown in FIG. 3C, the irregularly shaped PCM-filled cavities 144 are disposed in multiple layers in the solid gallium portion 13.

At typical room temperatures, gallium exists in the solid phase (its melting temperature is about 29° C.). Liquid gallium has high thermal conductivity, as compared to other typical fluids used in heat transfer applications (e.g., water, air, oils, etc.). There is strong evidence that gallium performs very well in transferring heat when it is brought into direct contact with the heat source. For example, cooling hot water by allowing it to lose its heat to gallium while being in direct contact with the gallium proved to be more effective than transferring the heat of the hot water to the gallium sink through a solid wall separating the hot water from the gallium sink (e.g., a tube wall or solid metallic plate, etc.). Despite the above attractive features of gallium as a heat transfer medium, sink materials such as gallium still have a negative feature that, if not dealt with properly, may offset the superior heat-transfer-favoring features highlighted above. This adverse effect is the low specific heat capacity of such sink materials. For example, the low specific heat of gallium makes it difficult for a certain amount of gallium to take any appreciable amount of heat from the to-be-cooled source without experiencing a clear temperature rise. This temperature rise results in a pronounced drop in the temperature difference between gallium and the heat source. It should be recalled that the temperature difference between the two bodies exchanging heat is the driving force for heat transfer, and when this gets smaller, so does the rate of heat exchange between the two bodies.

To overcome the above limitation due to low specific heat capacity of gallium, and consequently the diminishing temperature difference upon capturing heat from the heat source, it (as one way to overcome this problem) was suggested in the literature to suspend phase change materials (PCM) in the form of very small particles (at micro- or nanoscale) within the sink fluid (e.g., liquid gallium). Thereby, the specific heat capacity of the PCM-loaded sink fluid (which inherently is limited naturally) will be enhanced. This enhancement in the effective specific heat of the sink material can be explained by noting that the suspended PCM particles absorb latent heat during phase change without experiencing temperature rise. In other words, the heat transferred from the heat source to the high thermal conductivity sink material and then subsequently to the PCM will not be stored in the sink material as sensible heat, but as latent heat in the PCM particles (without causing temperature increase) for the whole sink matrix. Hence, this will restrict the tendency of the temperature of the low specific heat sink material from rising quickly upon receiving heat from the to-be-cooled heat source. This will help maintaining a high enough temperature difference between the sink and the source for the longest time possible during the heat exchange process, and consequently, this will lead to high heat exchange rates.

Until the present heat sink, the process of suspending PCM particles in low specific heat liquids to produce homogeneously dispersed micro- or nanoscale PCM particles in these liquids has typically been associated with many technical challenges, and so is not implemented yet at a wide commercial scale. According to the present heat sink, the PCM material is integrated in a high thermal conductivity material, such as liquid metals, the aim being production of a heat sink matrix. That sink matrix can be used for effective heat removal from heat sources that are in direct contact with them. The heat sources may be hot fluids or hot solids, such as the substrate of electronic devices. The present heat sink presents a more practical and easy way to implement the utilization of PCM discrete particles within sink materials that are characterized by low specific heat capacity, and at the same time, by high thermal conductivity. Examples of such sink materials are liquid metals in general, and gallium in particular.

In the present heat sink, relatively large pieces of PCM material are integrated into the solid gallium block 13, and need not be homogeneously distributed within the sink material (gallium) block. Relatively large PCM chunks are used and distributed in the solid gallium block. Benefit is obtained from the fact that gallium exists as solid phase at typical room temperatures (below about 29° C.). Thus, a gallium block with high thermal conductivity and PCM pieces integrated within it, the PCM pieces being relatively large sizes, which are randomly distributed in a non-engineered manner, or alternatively, distributed orderly in an engineered manner. The distribution of the PCM chunks within the gallium can be subjected to optimization so that optimum performance of the whole PCM-loaded sink can be attained. A prominent feature of the present heat sink is that it is not necessary to use a capsulation shell to enclose the used PCM chunks within. Instead, the PCM material is filled in certain cavities drilled inside the block of the sink body such that the sink material will be in direct contact with the PCM material filling the cavities, with no further barriers separating the two so that no additional thermal resistances are included in the whole matrix.

Cavities are made (holes or voids) in the solid gallium and filled with suitable PCM material with certain predetermined amounts (as per the design and the heat absorption amounts required). Once filled with the PCM material, the cavities are closed by a cap of the same solid-phase gallium to form a seal such that the PCM will not be able to leak out of the cavities upon melting when heat is supplied to it from the surrounding gallium that is received basically from the heat source. The PCM material inside the cavities will, in this case, be totally engulfed and submerged within the solid gallium body from all sides. The end result of the above is a solid block of the sink material made of gallium, which contains cavities filled with suitable PCM material. This PCM-loaded solid block can now be used as a sink for heat desired to be removed from a heat source. The heat source can be a hot fluid or a heat-generating electronic device, for example.

The heat source, being brought into a direct contact with the PCM-loaded solid block, or alternatively, the heat being taken from the heat source via a certain fluid (e.g., water) so that the heated fluid is allowed to directly lose its heat to the solid PCM-block sink, are exemplary use cases. The hot fluid in this case will be allowed to touch directly the upper gallium surface of the solid. This kind of direct contact between hot fluid and a substance like gallium proves to be more effective than letting the heat pass from the hot fluid to the gallium through tube walls or through solid metallic plate separating the two media.

The present heat sink may supply a ready-made-mix of blocks of solid gallium with cavities made within the solid gallium that are filled with certain suitable PCM content. These ready-made blocks can then be purchased in the market as sink blocks that can be fitted easily in a certain heat transfer application and be utilized as sinks for the heat removed from heat sources. The type and amount of PCM embedded within the solid block sink, as well as the size of the cavities and their shape, are all decided based on the heat amount to be removed and the working temperature ranges involved in the process. Other parameters that can be considered include the type and amount of the PCM used.

It should be recalled that gallium melts at a temperature around 29° C. Consequently, upon starting the heat exchange process between the PCM-loaded solid gallium block 13 and the heat source, the part of the gallium in direct contact with the heat source will start melting. So, when fabricating the PCM-loaded solid gallium block, care should be exercised to ensure that there will always exist a solid layer of the gallium covering the discrete PCM cavities, and that the amount of heat absorbed by the block will not cause a total melting of that solid gallium layer on top of the PCM-filled cavities. If the melting of the solid gallium was so immense to the extent that all gallium above the PCM cavities was melted, then the cavities will be ruptured and the PCM material will have the chance to escape the cavities and flow upward through the melted gallium layer above the cavities and be clustered on the top of the liquid gallium surface. When this happens, the PCM loses its role as a means to put control on the tendency for the gallium sink block temperature to increase quickly upon receiving heat from the heat source.

Based on the above restriction, the correct PCM-block size should be used for a certain application to ensure that the melting wave of the gallium that is in direct contact with the heat source will not reach the PCM cavities. The selection of the size of PCM-block that is to be fabricated or purchased for a certain heat source application would require the correct estimation of the amount of heat to be absorbed by the PCM-block as a whole and the portion of the heat that will be absorbed as latent heat by the PCM in the cavities, and the corresponding expected temperature rise and heat transfer rate for a certain source cooling application. Encapsulation of the PCM inside the cavities can be made so that the above restriction on the extent of gallium melting can be relaxed. But, this kind of encapsulation for the PCM adds further resistance to heat transfer from the surrounding gallium body to the PCM cavities.

The PCM-filled cavities have no extra boundaries (liners), and so the PCM material within will be directly contacting the surrounding sink material. In other words, there is no need to use capsulation material for the PCM in the cavities. Avoiding the need for encapsulation material for the PCM reduces the resistance to heat transfer between the solid gallium and the PCM inside the cavities. Additionally, in the present heat sink 10, there is no need to suspend the PCM chunks homogeneously in the solid gallium body, nor is there a need to have uniform shape and size for the discrete PCM chunks distributed within the solid sink material. Nonetheless, optimized distribution, shapes and sizes, as well as the careful placement of the PCM chunks, is always desirable. The PCM cavities can be randomly distributed within the solid block, yet a certain patterned optimized distribution of the PCM cavities within the solid block can also be adopted. The size of the PCM cavities can be chosen with no restrictions. The concern is to care mainly about the total proper amount of PCM material inserted in the cavities for a certain heat transfer application.

Encapsulation of the PCM material inside small capsules would also relax the restriction to use sink material in the solid phase. In this case, completely liquid phase sink material (e.g., liquid gallium) can be used from the beginning. However, having sink material like solid gallium with its inherent feature related to phase change at about room temperature makes it possible for the solid sink to absorb latent heat from the source without changing temperature. This effect is a benefit that is supported by the phase change effect of the PCM material within the cavities.

By exercising well the above selection task for the PCM-block for a certain heat source, we can preserve intact the PCM cavities without risking rupture of the cavity walls due to complete melting of the solid cap above them. This allows for repeated use of the sink block over and over again for different heat removal cycles.

This ensures sustainable continuous repeated use of the fabricated PCM-solid block sink. The solid gallium layer that closes the PCM cavities must not be melted completely, and the cavities must all the time be covered and sealed with a solid layer of the gallium. However, when a certain amount of heat is absorbed from the heat source by the solid PCM-loaded sink block repeatedly, then gradually more and more of the solid gallium layer above the cavities will melt. Hence, if the sink block continued receiving heat from the heat source, then eventually the whole solid gallium above the cavities will melt. In such a case, the cavities will be ruptured and the PCM within will escape upwardly and will layer itself on top of the melted gallium so that the PCM block is no longer viable or useful for any further effective repeated use.

In addition to the above point, even before reaching the point of rupturing the PCM cavities due to the melting of the whole solid gallium layer above the cavities, the PCM within the cavities might reach a complete melting upon receiving sufficient amount of heat from the surrounding gallium body. In such a case, the PCM within the cavities will no longer be useful as a phase change material, and it will not be able to play a significant role in maintaining a reasonably low temperature of the sink block anymore.

Under the above scenario, the temperature of the gallium will more noticeably continue rising upon receiving further heat from the heat source, and then the temperature difference between the gallium and the heat source will more clearly start declining, thereby adversely reducing heat removal rates from the heat source. To overcome the above issues caused by the complete melting of the PCM inside the cavities or the rupture of the cavities due to the melting of the solid gallium layer on top of the cavities, different techniques and options are available.

For example, the PCM-solid block could be used intermittently. This means, we allow a certain amount of heat to be absorbed by the PCM-solid block up to the point a certain pre-determined thickness of the solid gallium is maintained un-melted above the PCM cavities. When that limit of the solid gallium thickness above the cavities is reached, the heat transfer from the source should be stopped, and time should be allowed for the PCM-solid block to lose the heat it absorbed and the PCM inside the cavities to be regenerated and brought back to the solid phase again by allowing it to lose the latent heat it captured from the surrounding gallium that basically came from the to-be-cooled heat source. After completing the above process, the PCM-solid block will then be ready for a second repeated cycle of heat exchange with the heat source.

The aforementioned kind of intermittent cyclic operation of the PCM-solid block might not be so convenient. This might be appropriate for batch-kind of heat transfer operation, but not for continuous heat removal from the heat source. Moreover, this intermittent operation type may imply the need to use a bulky and unnecessarily excessive amounts of the solid block materials (both excessive amounts of the gallium, as well as the quantity of the PCM material used), should there be an intention to reduce the frequency of the intermittency of the operation, or even if the intermittent operation is to be avoided altogether. This issue of bulkiness of the sink block is obviously unattractive for different reasons.

A more attractive option that avoids the negative features and the drawbacks of intermittent operation, or at least reduces its extent, without the need to have a bulky system, is the "continuous heat transfer mode", which includes a means of continuous cooling of all the PCM-solid block that is implemented in parallel to the main process of heat capturing from the heat source by the block. This second option can be implemented by different ways that vary in cost and complexity.

To further enhance the capacity of the PCM material and the whole gallium system to do effective cooling of the heat source, or to reduce the overall time of the cooling process or to increase the amount of heat removed from the source, the PCM material within the cavities, and the solid block as a whole, needs to be cooled from within, while at the same time absorbing heat from the to-be-cooled heat source. This kind of internal cooling of the block will make it possible for the PCM in the cavities not to be completely melted while receiving heat from the surrounding solid block material, and so this will enable restricting the tendency of temperature rise within the gallium body. This will make it possible to realize a sufficiently high temperature difference between the sink block and the heat source; as highlighted earlier. As a result, this practice will enable avoidance of the undesirable intermittent operation mode. Also, this will help avoid the need for a big bulky sink block to accommodate large amounts of heat, where, in this case, part of the heat absorbed by the sink material is already conveyed to the internal heat removing system.

The consequences of the absence of an effective internal cooling process of the sink block while receiving heat from the heat source include the fact that the PCM inside the cavities will capture a certain amount of heat (as decided already by the designer of the whole system) and eventually get totally melted. Then the PCM needs to be regenerated and brought back to its original solid phase before being able to repeatedly capture heat from the source. The absence of an effective internal cooling mechanism of the sink block would require stopping the whole heat transfer operation to give the sink block the time needed to lose the heat it captured, and in order to extend the operational time before the need to do the above step of cooling the sink block, a larger amount of PCM and larger gallium sink body would be required so that the larger amount of heat can be removed before the whole process has to be stopped for PCM cooling and regeneration. To overcome the above limitations of intermittent operation and/or the need for a big sink, techniques are employed to do internal cooling of the sink block, while at the same time, heat is being absorbed from the heat source by the sink block.

As shown in FIG. 5, inclined tubes 99 may be inserted within the solid phase gallium layer 13. These tubes 99 need not penetrate through the PCM cavities within the gallium body, although it is possible to make them do so. Both ends of these tubes 99 are open (i.e., the tubes 99 have inlets and outlets) to the surrounding medium in which the sink block resides (the surrounding atmospheric air in the room, for example).

When the sink block receives heat from the heat source 125, part of this heat will stay in the gallium material and cause temperature rise of the gallium. Another part of that heat will pass from the gallium to the PCM inside the cavities, and a third part will pass to the inclined tubes filled with the fluid of the environment surrounding the block (e.g., room air). Of course, some of the heat will also escape through the outer sink block boundaries to the surrounding environment. The fluid inside the inclined tubes (e.g., air from the surroundings) will then get heated and due to the inclination of the tubes and the induced buoyancy body forces, will flow upward by natural effects without the need for an external forcing mechanism, such as a fan or pump. Yet, a forcing mechanism to force circulation through the inclined tubes 99 can still be implemented to aid more effective heat removal and internal cooling of the sink block. This later scenario of forced circulation mechanism through the inclined tubes 99 would add to the complexity and the cost of the whole system. Thus, this option should be avoided, if possible.

The heat passed from the sink block to the fluid inside the inclined tubes 99 by natural (or alternatively, by forced convection) to the upwardly flowing fluid in the inclined tubes 99 will do cooling of the sink block, and hence will at the same time help keep part of the PCM material within the cavities in the solid phase. This will assure that the PCM will all the time just absorb latent heat from the material of the solid block surrounding the cavities, and hence will restrict any significant rise in the overall block temperature. This, as described earlier, will maintain a sufficiently high temperature difference (hence high heat transfer rate) between the sink block and the to-be-cooled heat source. In addition, since the inclined tubes 99 will also be working on cooling directly the sink block, then this will make it possible to have an optimally small block size for a certain heat transfer application, and also less PCM material is needed.

Furthermore, employment of the above features of the inclined tubes 99 increases the chance for longer time of continuous operation of the heat removing process from the source without the need to have interruption in the operation before the PCM cavities possibly reach their maximum phase change heat absorption limit under operational conditions requiring excessively large heat removal rates.

Different variations of the above described inclined tubes 99 can be implemented. For example, the inlet and exit of the tubes can be in direct connection to a surrounding fluid other than the ambient atmospheric air in the room. As another alternative suggestion to that, the sink block can be immersed in an outer tank filled with other fluids, such as liquid water or other relevant fluid. The water will circulate upwardly within the inclined tubes due to density variations due to the heat it receives from the sink block, in the way similar to the case of air being the circulated fluid through the tubes, as described above. The water heated inside the inclined tubes will get the chance to get cooled when it exits the upper end of the tubes, where it is going to be exposed to the outer surrounding air environment (which is typically air-conditioned, in case of indoor operation). Other techniques may still be added to cool down the heated water inside the inclined tubes, as deemed to be needed by the designer of the whole system.

Moreover, as another variation of the structure of the inclined tubes 99, these tubes may be chosen to be of the closed loop type, in that they can be simply made to act as typical heat pipes. The volatile material inside these heat pipes absorbs the heat from the sink block and then gets condensed on the condensing side of the heat pipe. It should be noted that non-hollow solid inclined (or non-inclined) metallic tubes can also be disposed within the sink body to act like fins that can pass the heat out of the sink to the outer air-conditioned space around. This can be added to the features that the present heat sink 10 may encompass.

Integrating any of the different variations for internal cooling of the sink block (as described above) gives the chance of higher heat-removing capacity from the heat source. The different ideas and concepts outlined above will then facilitate and help implement more expanded and creative ideas for dumping large amounts of heat into the sink block. This means that more pronounced cooling can be done for heat-generating devices, and thus push the edge higher for more effective and larger capacity industrial applications where excessive heat removal is sought.

As an example of ideas where more effective dumping of heat from a heat source to a sink like the ones proposed above, the bubbling of a hot fluid is suggested, using, e.g., hot water coming from a heat source, into the melted liquid gallium in the slurry portion 19 of the sink block. As already known, the direct bubbling of hot fluid into an immiscible high thermal conductivity liquid bath (e.g., liquid gallium) will allow for enhancement in the heat transfer from the bubbled hot fluid to the bath through which the hot fluid is bubbled. Consequently, this bubbling technique will mean that more heat can be dumped into the solid sink block that can subsequently easily and effectively be handled, due to the help provided by the PCM material and the additional integrated internal cooling tubing mechanisms highlighted above. It should be emphasized that the above concepts using internal tubing cooling methods in the way described above can still be implemented, even for a solid block sink that does not include PCM material cavities. Yet, the presence of the PCM cavities beside the proposed tubes concept will facilitate further enhanced heat removal from heat sources.

Features of the present heat sink provide an effective and simple way to integrate PCM material within superior materials (sink) for heat transfer applications in a way that allows overcoming current technical difficulties to do so. Moreover, there are no restrictions of the way the PCM is to be distributed within the sink. Additionally, the present heat sink gives the chance to prepare ready-made sink PCM-based blocks that can be used for different kinds of heat transfer industries. These ready-made blocks can be marketed easily for different industries. The present heat sink 10 is built based on concepts of direct contact heat transfer between bodies, such as liquid metals and the heat source. The present heat sink gives the chance to creatively implement effective practices to dump large amounts of heat into a sink medium. For example, implementing the bubbling direct contact heat exchange method to remove large amounts of heat from a hot fluid is becoming very feasible. The present heat sink can be very compact, and it can avoid the interruption needed to do regeneration for the PCM material by implementing the suggested additions in the form of internal inclined tubes based on simple natural mechanisms. The present heat sink can be custom-made and sized for a wide range of heat exchange applications. The present heat sink allows pushing up the threshold of maximum potential and use of superior coolants that have special heat exchange features, such as liquid metals. The present heat sink has a simple design and manufacture that allows for increasing the ability to remove heat from heat-generating sources, and hence it allows for expanding the operational limits of existing heat generation systems that require cooling, which is a very decisive situation for such applications as electronics devices and computers.

The heat sink material has a melting point(s) below or no higher than the temperatures that the hot fluid is desired to be cooled to, such that during the cooling of the hot fluid, partial melting of the solid sink material (solid-phase gallium) will take place. With the help of the present heat sink with the PCM integrated within the sink, there is no complete melting of the sink material. Hence, an upper limit of the sink material temperature is set during the heat exchange that is due to the heat captured by the PCM material. The partial melting of the heat sink material will ensure that the hot to-be cooled fluid is exchanging heat directly with the melted part of the sink material.

Figure 4:
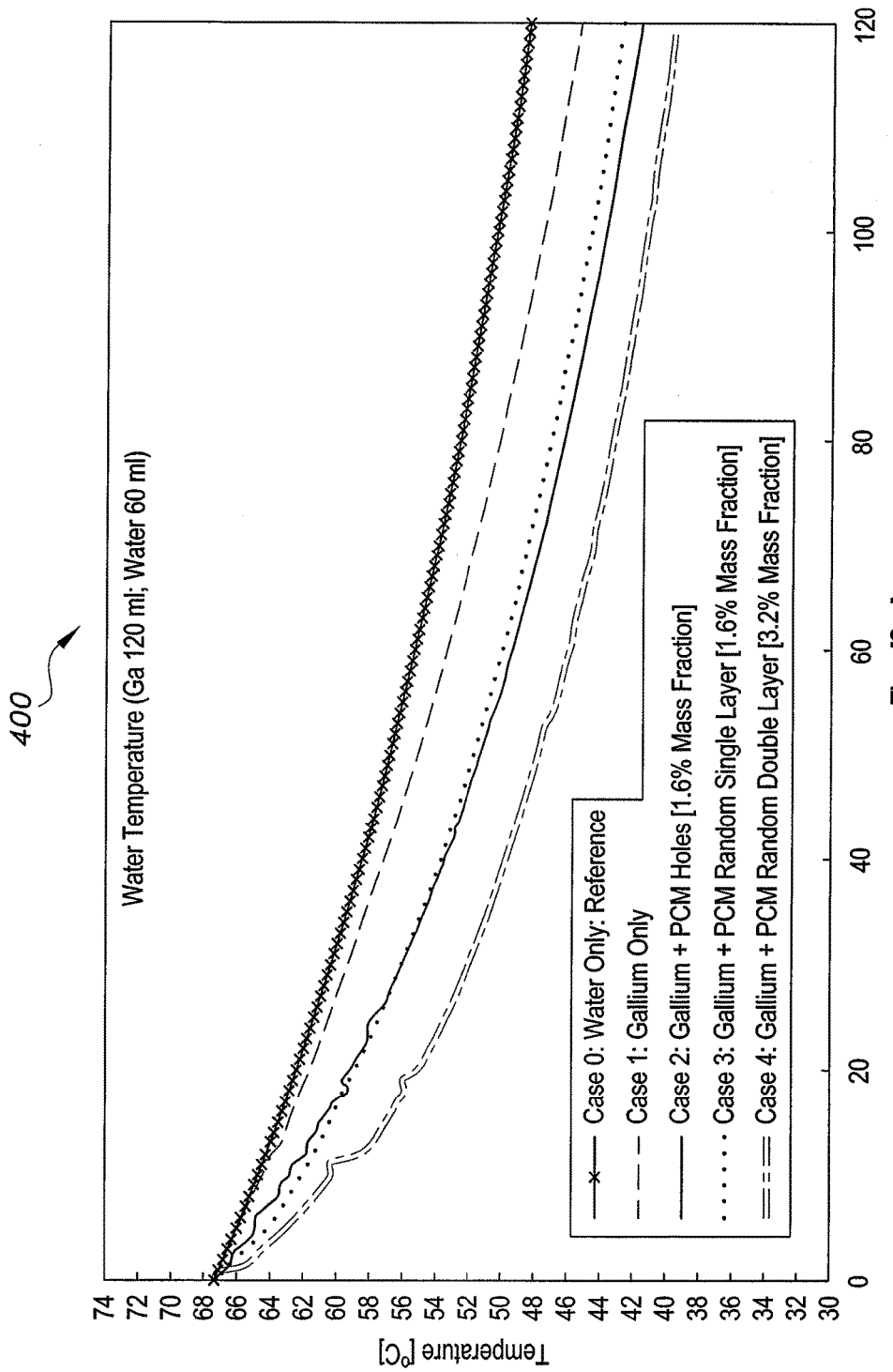
FIG. 4 is a plot comparing the rate of cooling of hot water without a heat sink with cooling hot water using a heat sink made of solid-phase gallium (with a liquid-phase interface), and with heat sinks having phase change material disposed in cavities distributed in solid-phase gallium as shown in FIGS. 3A, 3B and 3C.

To validate the feasibility of the present heat sink 10, preliminary tests were conducted that show the cooling history of a batch of hot water poured on top of a gallium block in a heat sink. For one of the experiments conducted, the heat sink used was a solid cylinder with PCM holes disposed therein. The experimental setup included temperature probes disposed in the gallium slurry, the solid gallium, and a supporting layer of water. The cooling history of the hot water was monitored, one time with the hot water being cooled while having no PCM in the heat sink container, but only gallium (both melted layer and solid part), while in the other case, with PCM integrated within the solid part of the gallium. The experiments were also repeated, but with the randomly distributed unstructured PCM cavities 144 shown in FIGS. 3B and 3C replacing the structured pattern of the PCM holes. The cooling history results for the hot water are depicted in plot 400 of FIG. 4. Clearly, the presence of the PCM in any of the suggested ways (whether structured or unstructured patterns) gives superior cooling rates for the hot water. All experiments were conducted under the same outer boundary conditions. The bottom brass base of the heat sink was allowed to be touching a big body of cold water at room temperature to ultimately dissipate the heat to it.

It should be noted, that the above described procedure and results are just to demonstrate that the claimed concept is working well. Further testing to optimize the processes and come up with the best way to implement the proposed concepts and ideas can be pursued with the different additional features indicated in the disclosure and in the above parts. For example, the integration of the inclined tubes within the sink to allow for natural circulation of cool air from the air-conditioned space around the system, as well as the inclusion of finned outer surfaces for the sink casing, and possibly the inclusion of a small fan to force the surrounding cool air around the outer heat sink walls, etc., are options that can be added to the system. Also, the way hot water is allowed to lose its heat to the sink material in direct contact can be significantly improved by possible bubbling of the hot water within the melted layer of the sink material by using a bubbles dispenser to cause enhanced convective heat transfer. The last option of hot water bubbling would entail the need to optimize the PCM arrangement and structure and the possible PCM type to be selected in such a way as to increase the ability of the PCM to receive more heat from the surrounding solid material in the sink, and hence decrease the melting rate of the sink material and thereby increase the working time of the sink material or decrease the need for bulky sink. Data for plot 400 included cooling history of a batch of hot water (60 ml) sitting on top of a gallium liquid body. In some of the experiments, the gallium did not include PCM integrated within it. In the other three cases, the solid part of the gallium included PCM in three different ways. In two of these experiments, 1.6% (on mass basis) of a PCM was injected in cylindrical, structured cavities, as well as provided as a random single layer. In the other PCM test, double random layers of PCM chunks were arranged such that a total volume fraction (PCM to gallium) of about 3.2% was attained in the sink body.

As can be seen from the results, the presence of PCM leads to significantly faster cooling rates of the hot water than when no PCM is used. Furthermore, the presence of more PCM in the sink matrix leads to further enhancement in the rate of water cooling. The initial hot water temperature for all tests is around 70° C., and after 30 seconds from the start, the water dropped temperature by about 15° C. when PCM is used with 3.2% PCM content. Further testing and optimization of the PCM-gallium system can still be introduced, aiming at maximizing the benefit of this new concept and enhancing the heat transfer rates from the heat source. Some possible suggestions were described above. Two of the curves shown in plot 400 correspond to the cooling of the hot water in reference cases with no PCM. In one of these cases, the water was alone in the container with neither gallium nor PCM. In that experiment, water was cooling under the same boundary conditions as those in the tests with PCM. In the other reference test, we cooled hot water while being in direct contact with gallium (melted layer and a solid layer of gallium beneath it), but without integrating PCM within the gallium. Once more, by comparing the results that correspond to these two reference cases with the cases with PCM, the advantages of using the present PCM integration are quite evident. In all cases, the initial temperature of the hot water at the start of the process was about 68° C. to 70° C. It can be seen that the case with 3.2% PCM in the gallium sink leads to the fastest hot source temperature reduction with time. The impact of PCM in all cases including PCM is quite clear. However, with further optimization of the amount and distribution and kind of PCM in the sink block, it can be expected to attain further enhancement in the cooling rates of the hot sources placed in direct contact with the sink.

It is to be understood that the present invention is not limited to the embodiments described above, but encompasses any and all embodiments within the scope of the following claims.

We claim:

1. A heat sink, comprising:
a body of solid-phase elemental material defining at least one contact face adapted for direct contact with a heat source requiring cooling, the body of solid-phase material having a plurality of sealed cavities defined therein, wherein the body of solid-phase material has a thickness between the at least one contact face and the cavities defining an interface region of melted solid-phase material extending from the at least one contact face toward the cavities when the heat source is placed in direct contact with the at least one contact face, the interface region leaving the cavities intact; and
unencapsulated phase change material having a higher specific heat capacity than the solid-phase material and being disposed in the cavities and being in direct contact with the body of solid-phase elemental material.

2. The heat sink according to claim 1, wherein the body of solid-phase material is gallium.

3. The heat sink according to claim 1, wherein said phase change material is selected from the group consisting of a paraffin, a fatty acid, n-hexadecane, and n-heptadecane.

4. The heat sink according to claim 1, wherein the configuration of said cavities is selected from the group consisting of uniformly spaced apart, randomly spaced apart, uniformly shaped, and randomly shaped.

5. The heat sink according to claim 1, further comprising a housing defining a container having at least one open face dimensioned and configured for exposing the at least one contact face of said body of solid-phase material.

6. The heat sink according to claim 5, wherein said container has an open top, whereby the heat source is placed above said at least one contact face of said body of solid-phase material.

7. The heat sink according to claim 5, wherein said housing is made from thermally conductive material, whereby said body of solid-phase material may be cooled by a cooling source.

8. The heat sink according to claim 7, wherein said housing has fins extending externally from the container.

9. The heat sink according to claim 7, wherein said housing has fins extending into the body of solid-phase material.

10. The heat sink according to claim 5, further comprising means for cooling said body of solid-phase material.

11. The heat sink according to claim 5, further comprising a plurality of cooling tubes extending through said housing and said body of solid-phase material at an oblique angle.

12. The heat sink according to claim 11, wherein said tubes have opposing ends open for passage of ambient air through said tubes.

13. The heat sink according to claim 11, further comprising means for forcing passage of a cooling fluid though said tubes.

14. The heat sink according to claim 1, wherein said phase change material comprises an inorganic phase change material.

15. The heat sink according to claim 1, wherein said at least one contact face adapted for direct contact with a heat source is in a liquid or semi-solid phase.

16. The heat sink according to claim 1, wherein said at least one contact face adapted for direct contact with a heat source is on the top surface of the solid-phase material.

17. The heat sink according to claim 1, wherein said at least one contact face adapted for direct contact with a heat source is on the bottom surface of the solid-phase material.

18. The heat sink according to claim 1, wherein said at least one contact face a plurality of contact surfaces adapted for direct contact with a heat source, wherein the plurality of contact surfaces includes the top and bottom surfaces of the solid-phase material.

19. The heat sink according to claim 6, wherein said container is inverted U-shaped in configuration and the heat source is placed above the U and the plurality of sealed cavities are located in the legs of the U.

20. The heat sink according to claim 19, wherein said contact face on the bottom surface of the solid-phase material is located within the U and between the legs of the U.

* * * * *